United States Patent
Yoshida

(10) Patent No.: US 10,372,067 B2
(45) Date of Patent: Aug. 6, 2019

(54) ELECTROPHOTOGRAPHIC BELT AND ELECTROPHOTOGRAPHIC IMAGE FORMING APPARATUS

(71) Applicant: CANON KABUSHIKI KAISHA, Tokyo (JP)

(72) Inventor: Toshiyuki Yoshida, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/988,180

(22) Filed: May 24, 2018

(65) Prior Publication Data

US 2018/0348672 A1 Dec. 6, 2018

(30) Foreign Application Priority Data

May 30, 2017 (JP) .................................. 2017-106887
Apr. 27, 2018 (JP) .................................. 2018-087298

(51) Int. Cl.
| | |
|---|---|
| *G03G 15/16* | (2006.01) |
| *H01J 37/28* | (2006.01) |
| *B32B 27/08* | (2006.01) |
| *H01B 1/24* | (2006.01) |
| *C09C 1/56* | (2006.01) |
| *G03G 15/20* | (2006.01) |

(52) U.S. Cl.
CPC ........... *G03G 15/162* (2013.01); *B32B 27/08* (2013.01); *C09C 1/56* (2013.01); *G03G 15/2053* (2013.01); *H01B 1/24* (2013.01); *H01J 37/28* (2013.01)

(58) Field of Classification Search
None
See application file for complete search history.

(56) References Cited

U.S. PATENT DOCUMENTS

| | | | |
|---|---|---|---|
| 6,432,324 B1 | 8/2002 | Yoshida et al. | |
| 9,423,727 B2 | 8/2016 | Yoshida et al. | |
| 9,581,941 B2 * | 2/2017 | Egawa | G03G 15/162 |
| 9,733,596 B1 * | 8/2017 | Furukawa | G03G 15/1685 |
| 2007/0020450 A1 | 1/2007 | Kitamura et al. | |

FOREIGN PATENT DOCUMENTS

| | | |
|---|---|---|
| JP | 2007-130803 A | 5/2007 |
| JP | 4470654 A | 6/2010 |
| JP | 5744506 A | 7/2015 |

* cited by examiner

*Primary Examiner* — Victor Verbitsky
(74) *Attorney, Agent, or Firm* — Venable LLP

(57) ABSTRACT

Provided an endless belt-shaped electrophotographic belt comprising an electro-conductive base layer comprising a thermoplastic resin and carbon black, the base layer is a cylindrical extrusion product of a resin mixture comprising the thermoplastic resin and the carbon black, and when observing a cross section of the cylindrical extrusion product with a transmission electron microscope and obtaining an electron image under conditions of a resolution of 0.01 to 1 nm/pixel and a lowest gray of more than 0 and a highest gray of less than 255, and extracting from the TEM image a square region of 100 nm a side in which the carbon black occupies 50 area % or more, among pixels resulting from the carbon black and constituting 1% by frequency from the lowest gray in the square region, pixel group constituted by the pixels that are mutually adjacent, has an area of at least 10 $nm^2$.

7 Claims, 4 Drawing Sheets

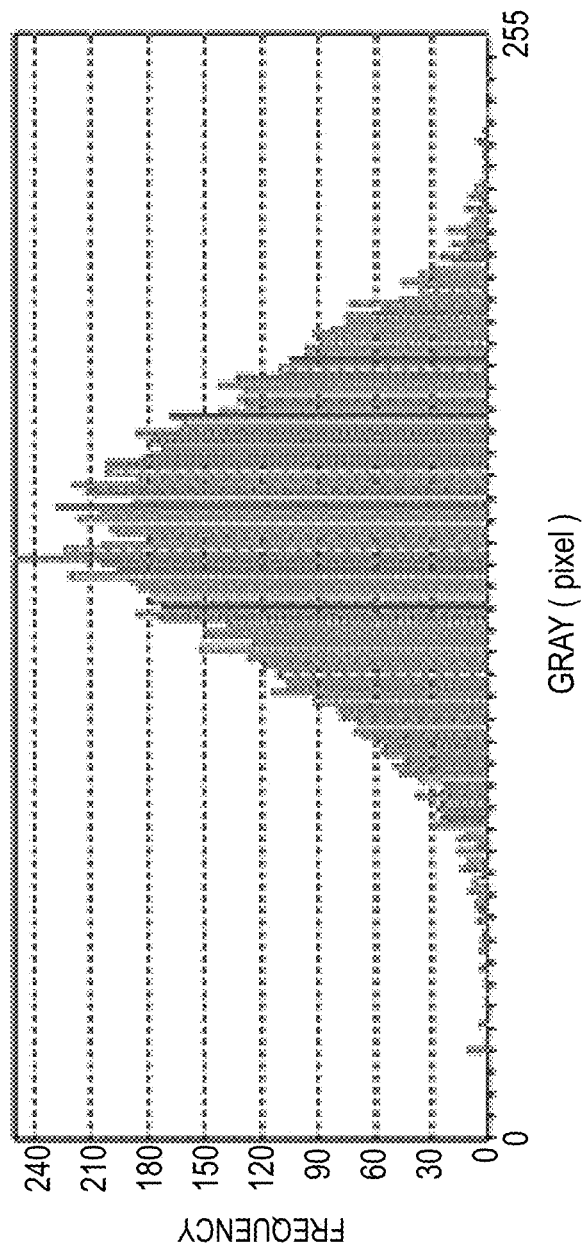

ELECTROPHOTOGRAPHIC BELT AND ELECTROPHOTOGRAPHIC IMAGE FORMING APPARATUS

BACKGROUND OF THE INVENTION

Field of the Invention

The present disclosure relates to an electrophotographic belt for use in an electrophotographic image forming apparatus and an electrophotographic image forming apparatus.

Description of the Related Art

Semi-electro-conductive members such as a charging belt, a charging roller, an electrophotographic belt and a transfer roller are disposed in an electrophotographic image forming apparatus (hereinafter, referred to as "electrophotographic apparatus") such as a copier or a laser beam printer.

As an electro-conductive member, an electrophotographic belt, for example, an intermediate transfer belt is known as a monolayer belt including only a base layer or an intermediate transfer belt which includes a base layer coated with a surface layer or which includes multi layers having an elastic layer and also a surface layer on a base layer.

Conventionally, a resin composition in which carbon black as an electro-conductive filler is added to a thermosetting resin including a polyimide resin to thereby adjust the electrical resistance value has been heavily used in the material for use in a base layer.

A polyimide resin, however, is expensive and requires a long time such as several tens of minutes as the thermal curing time thereof, and therefore a thermoplastic resin that is more inexpensive and that can be produced in a short time cycle has attracted attention as a new material for a base layer from the viewpoint of production cost.

Japanese Patent Application Laid-Open No. 2007-130803 describes a production method for providing a base layer of an electro-conductive endless belt having a thickness of 100 μm by melt-extruding an electro-conductive resin composition, where carbon black as an electro-conductive filler is added into a thermoplastic resin, through a cylindrical die to provide a tube-shaped extrusion product and thereafter supporting and cooling such an extrusion tube on the periphery of a cooling member disposed in the inner side of the extrusion tube.

SUMMARY OF THE INVENTION

One aspect of the present disclosure is directed to providing an electrophotographic belt that is a cylindrical extrusion product small in thickness variation.

In addition, another aspect of the present disclosure is directed to providing an electrophotographic image forming apparatus that can form a high-quality electrophotographic image.

According to one aspect of the present disclosure, there is provided an endless belt-shaped electrophotographic belt comprising an electro-conductive base layer comprising a thermoplastic resin and carbon black, wherein the base layer is a cylindrical extrusion product of a resin mixture comprising the thermoplastic resin and the carbon black, and when observing a cross section of the cylindrical extrusion product with a transmission electron microscope and obtaining a TEM image under conditions of a resolution of 0.01 to 1 nm/pixel and a lowest gray of more than 0 and a highest gray of less than 255, and extracting from the TEM image a square region of 100 nm a side in which the carbon black occupies 50 area % or more, among pixels resulting from the carbon black and constituting 1% by frequency from the lowest gray in the square region, pixel group constituted by the pixels that are mutually adjacent, has an area of at least 10 nm².

According to another aspect of the present disclosure, there is provided an electrophotographic image forming apparatus comprising: an electrophotographic photosensitive member; an intermediate transfer belt, to which a toner image not fixed, formed on the electrophotographic photosensitive member, is to be primarily transferred; and a secondary transfer unit that secondarily transfers a toner image transferred on the intermediate transfer belt, to a recording medium, wherein the intermediate transfer belt is the afore-mentioned electrophotographic belt.

Further features of the present disclosure will become apparent from the following description of exemplary embodiments with reference to the attached drawings.

BRIEF DESCRIPTION OF THE DRAWINGS

FIG. 2 is a graph representing the gray distribution of the TEM image of FIG. 1.

DESCRIPTION OF THE EMBODIMENTS

Figure 1:
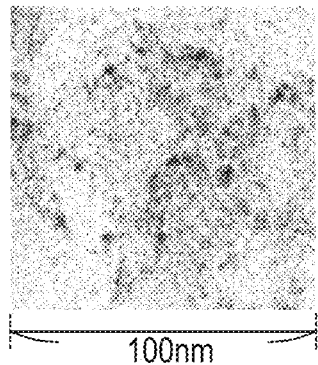
FIG. 1 is an image of carbon black contained in a resin composition by transmission electron microscope (TEM).

Preferred embodiments of the present disclosure will now be described in detail in accordance with the accompanying drawings.

In recent years, an electrophotographic apparatus has been progressively further decreased in price and an electrophotographic belt has also been demanded to be more inexpensive while allowing a conventional print image quality to be maintained. Therefore, the present inventor has conducted studies for a reduction in the thickness of a belt base layer for the purpose of reducing the material cost. The base layer of an electrophotographic belt mainly including a resin composition including thermoplastic resin and carbon black, produced by the method according to Japanese Patent Application Laid-Open No. 2007-130803, however, tends to be larger in thickness variation as the base layer is thinner.

A part of the base layer, thicker in the thickness than the periphery thereof, is relatively high in the electrical resistance value and a current necessary for toner transfer is difficult to supply to such a part. On the other hand, a part of the base layer, thinner in the thickness than the periphery thereof, if present, cannot be sufficiently in contact with a photosensitive drum in primary transfer, causing the amount of a toner transferred from the photosensitive drum to the belt to be decreased. Thus, the thickness variation of the base layer of the electrophotographic belt can have a large effect on the image quality.

Meanwhile, when a resin mixture being molten is extruded through a cylindrical die to produce a cylindrical extrusion product having a tube shape, the fluidity of the resin mixture being molten may be partially changed due to the influence of the surrounding environment, causing an extrusion product large in thickness variation to be formed.

Installation of equipment that can block the influence of the environment in molding, however, causes an increase in cost of an electrophotographic belt.

The present inventor has then understood that a technique for a much more reduction in the thickness variation of a cylindrical extrusion product according to a method different from critical control of the surrounding environment in production of a cylindrical extrusion product is needed to be developed. The present inventor has made studies in view of such understanding in order to provide an electrophotographic belt that is a cylindrical extrusion product small in thickness variation.

The present inventor has made studies, and as a result, has found that one cause of the occurrence of thickness variation in a cylindrical extrusion product is a contact flow resistance at the interface between a thermoplastic resin and carbon black in extrusion. The present inventor has then found that carbon black having a fine convex portion on the surface thereof can be used as such carbon black to suppress the contact flow resistance at the interface between a thermoplastic resin and carbon black, thereby providing a cylindrical extrusion product small in thickness variation. The present disclosure has been made based on such findings.

The present inventor considers the reason why a electrophotographic belt in which a darker and finer region is present in the surface of carbon black than in the periphery thereof in observation by transmission electron microscope (TEM) can solve the problem, as follows.

The light and dark in a TEM image depends on the amount of a transmission electron. As the amount of a transmission electron is larger, the image is lighter, and as the amount of a transmission electron is smaller, the image is darker. The amount of a transmission electron then depends on the distance of transmission of a sample. As such a distance of transmission is longer, the amount of a transmission electron is smaller. In addition, as the distance of transmission is shorter, the amount of a transmission electron is larger.

Accordingly, it is considered that carbon black where a dark region is observed in a TEM image has a fine convex portion on the surface thereof. That is, it is considered that when a transmission electron passes through carbon black, the passing distance in the carbon black is longer in a case where such an electron is transmitted to a part having a convex shape than a case where such an electron is transmitted to a part having no convex portion, and therefore the amount of a transmission electron is smaller to form a darker image, resulting in a contrast represented in the TEM image.

Next, the thickness variation is described.

When a resin composition including a thermoplastic resin and carbon black is melt-extruded to provide a tube shape, the thermoplastic resin, generally being molten, meets with a flow resistance of the carbon black. The thermoplastic resin, located on the periphery of the carbon black, is in the state of turbulent flow due to the flow resistance, and the flow of the resin is not even. Therefore, the influence of the temperature serving as the disturbance unevenly acts on the resin composition, causing thickness variation in the resulting tube-shaped extrusion product.

On the other hand, it is considered that, when the resin composition including a thermoplastic resin and carbon black is melt-extruded to provide a tube shape, the carbon black has a fine convex portion on the surface thereof, thereby allowing the contact area with the thermoplastic resin to be reduced, and allowing the flow resistance to be suppressed as compared with carbon black not having any fine convex shape formed on the surface thereof. It is considered that the thermoplastic resin, located on the periphery of the carbon black, is in the state of laminar flow and the resin evenly flows, and therefore is hardly affected by the temperature serving as the disturbance and enables the thickness variation of a tube-shaped extrusion product to be suppressed as compared with a case where carbon black not having any fine convex portion on the surface thereof is used.

Figure 3A:
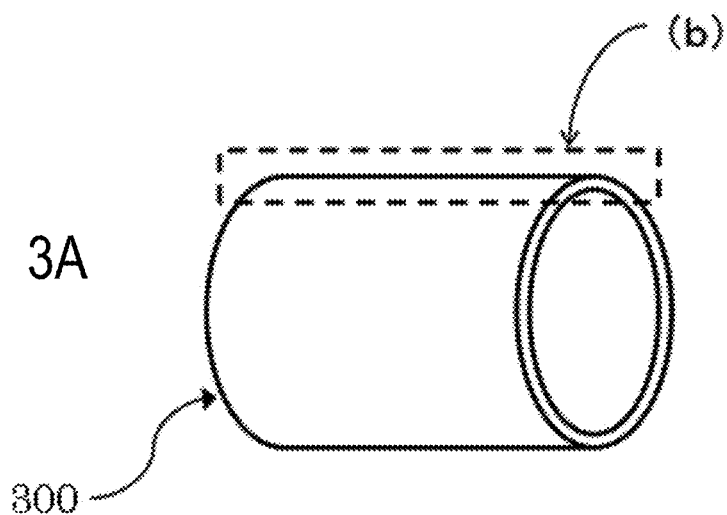
FIG. 3A is a schematic perspective view of an electrophotographic belt.
Figure 3B:
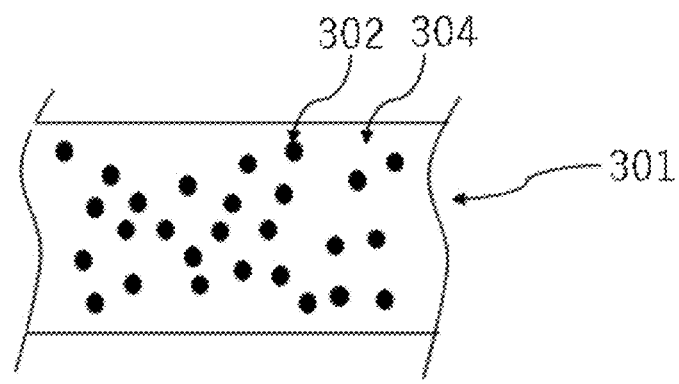
FIG. 3B is an enlarged view of the cross section in a direction perpendicular to the circumferential direction of the electrophotographic belt.

An electrophotographic belt according to one aspect of the present disclosure is an endless belt-shaped electrophotographic belt including an electro-conductive base layer including a thermoplastic resin and carbon black. FIG. 3A is a schematic perspective view of an electrophotographic belt 300, and FIG. 3B is an enlarged view of the cross section in a direction perpendicular to the circumferential direction of the electrophotographic belt 300.

An electro-conductive base layer 301 is a cylindrical extrusion product of a resin mixture including a thermoplastic resin 304 and carbon black 302. When observing a cross section of the cylindrical extrusion product with a transmission electron microscope and obtaining a TEM image under conditions of a resolution of 0.01 to 1 nm/pixel and a lowest gray of more than 0 and a highest gray of less than 255, and extracting from the TEM image a square region of 100 nm a side in which the carbon black occupies 50 area % or more, among pixels resulting from the carbon black and constituting 1% by frequency from the lowest gray in the square region, pixel group constituted by the pixels that are mutually adjacent, has an area of at least 10 $nm^2$.

Hereinafter, an exemplary embodiment of the present disclosure is described in detail.

<Thermoplastic Resin>

The thermoplastic resin that can be used is not particularly limited. In the case of an application where the intermediate transfer belt is mounted to an electrophotographic apparatus, however, any resin listed below is used as the thermoplastic resin.

Examples include polyester, polypropylene, polyethylene (high-density, medium-density, low-density and linear low-density), polybutadiene, polyisobutylene, polyamide, polyamideimide, polyacetal, polyarylate, polycarbonate, polyphenylene ether, modified polyphenylene ether, polyimide, liquid crystalline polyester, polyethylene terephthalate, polyethylene naphthalate, polysulfone, polyethersulfone, polyphenylene sulfide, polybisamide triazole, polybutylene terephthalate, polyetherimide, polyether ether ketone, an acrylic polymer, polyvinylidene fluoride, polyvinyl fluoride, an ethylene-tetrafluoroethylene copolymer, a chlorotrifluoroethylene copolymer, hexafluoropropylene, a perfluoroalkyl vinyl ether copolymer, an acrylic acid alkyl ester copolymer, a polyester-ester copolymer, a polyether-ester copolymer, a polyetheramide copolymer and a polyurethane copolymer. Such resins may be used singly or in combinations of two or more.

Furthermore, a thermoplastic resin classified to an engineering plastic or a super-engineering plastic can be adopted as the thermoplastic resin in consideration of durability. Specific examples include polyether ether ketone (PEEK), polyethylene sulfide (PPS), polycarbonate (PC), polyvinylidene fluoride (PVDF), polyethylene terephthalate (PET) and polyethylene naphthalate (PEN). Furthermore, among these, polyether ether ketone (PEEK) or polyphenylene sulfide (PPS) can be adopted because of being high in surface hardness and being hardly scraped even in use.

With respect to each of PEEK and PPS, commercially available products of various grades are provided. Such products can be used as products of a single grade or a combination of products of two or more grades.

Examples of commercially available products of PEEK include "Victrex PEEK" (trade name) series manufactured by Victrex PLC. Examples of such grades include grades "PEEK450G", "381G" and "151G".

Examples of commercially available products of PPS include "Torelina" (trade name) series manufactured by Toray Industries, Inc. and PPS resins (trade name: "Super tough PPS", "glass fiber reinforced PPS", "inorganic filler reinforced PPS" and "modified/alloy PPS") manufactured by DIC Corporation. Examples of such grades include grades "Torelina A-900", "A670X01" and "A756MX02".

<Carbon Black>

The carbon black 302 according to the present embodiment is obtained by, for example, subjecting commercially available carbon black to a treatment described below, thereby performing a treatment for formation of a fine convex portion on the surface.

Herein, the carbon black before such a treatment may be referred to as "raw material carbon black". In addition, the carbon black after such a treatment, having a fine convex portion on the surface thereof, may be referred to as "carbon black treated" or simply referred to as "carbon black".

The content of the carbon black treated in the base layer is 5 parts by mass or more and 40 parts by mass or less, particularly preferably 5 parts by mass or more and 30 parts by mass or less based on 100 parts by mass of the thermoplastic resin. When the proportion of the carbon black is within the range, the electrical resistance of an electro-conductive member can be within a desired range and the mechanical strength is also favorable.

Various known carbon blacks can be used as the raw material carbon black. Specific examples include the following:

ketjen black, furnace black, acetylene black, thermal black and gas black.

Among these, acetylene black can be adopted because of having few impurities, being low in frequency of failure due to foreign substances when molded together with the thermoplastic resin into a film, and easily imparting a desired electro-conductivity. Specific examples of acetylene black include "Denka Black" series (manufactured by Denka Company Limited), "Mitsubishi electro-conductive filler" series (manufactured by Mitsubishi Chemical Corporation), "Vulcan" series (manufactured by Cabot Corporation), "Printex" series (manufactured by Degussa AG) and "SRF" (manufactured by Asahi Carbon Co., Ltd.).

<Treatment Method of Carbon Black>

A treatment method including forming a fine convex portion on the surface of the raw material carbon black to provide the carbon black 302 according to the present embodiment is described.

The treatment for formation of a fine convex portion on the surface of the raw material carbon black includes a first step of attaching an organic substance onto the surface of carbon black and a second step of firing the organic substance attached.

First, the first step of attaching an organic substance onto the surface of the raw material carbon black is described.

The step of attaching an organic substance onto the surface of the raw material carbon black, although the raw material carbon black in the form of a solid powder may be mixed with the organic substance, can be performed in a liquid because the organic substance is difficult to evenly attach on the surface. The step of attaching the organic substance on the surface of the raw material carbon black in a liquid is here described.

The first step is a step of dissolving an organic substance in a solvent to provide a solution in which the organic substance is dissolved, and then adding the raw material carbon black to the solution in which the organic substance is dissolved and stirring the resultant to provide a raw material carbon black dispersion liquid.

The solvent that can be used is water or an organic solvent, and water can be adopted in consideration of handleability and environmental load. A common dispersant may also be used in order to improve the dispersion state of the raw material carbon black.

The organic substance to be attached to the raw material carbon black can be one high in affinity to the surface of the raw material carbon black and also high in affinity to the solvent. Specific examples include an organic compound called a cationic surfactant, an anionic surfactant or a nonionic surfactant. Among these, a nonionic surfactant can be adopted which tends not to be roughened by aggregation even in taking-out of the carbon black to which the organic substance is attached, in a subsequent step.

Examples of the nonionic surfactant include ester type and ether type nonionic surfactants, and examples of the ester type nonionic surfactant include glycerin fatty acid ester, sorbitan fatty acid ester and sucrose fatty acid ester having a structure where each of glycerin, sorbitan and sucrose as a polyhydric alcohol is bound to fatty acid by an ester bond. Examples of the ether type nonionic surfactant mainly include polyoxyethylene alkyl ether, polyoxyethylene alkyl allyl ether and polyoxyethylene propylene glycol obtained by addition polymerization of a higher alcohol, alkyl phenol, propylene glycol or the like to ethylene oxide. Among these, polyoxyethylene alkyl ether can be adopted which has affinity also to the solvent and also has good affinity to the surface of electro-conductive carbon.

The dispersant used is not necessarily used singly, and may be used in combinations of a plurality of dispersants.

The amount of the organic substance added to and dissolved in the solvent can be adjusted so as to correspond to the saturation solubility or less in 100 parts by weight of the solvent and to allow the mass ratio "A/B" to be 0.1 or more and 20 or less in the assumption that the part(s) by mass of the raw material carbon black and the part(s) by mass of the organic substance based on 100 parts by weight of the solvent are defined as A and B, respectively.

The amount of the organic substance added can be the saturation solubility or less, thereby suppressing precipitation of the organic substance and allowing the treatment of the raw material carbon black to be more easily performed.

In addition, the mass ratio of the carbon black and the organic substance can be 0.1 or more, thereby allowing the amount of the organic substance relative to the amount of the carbon black to be proper, to decrease the amount of an organic substance which cannot be attached onto the surface of the raw material carbon black and which floats. In addition, the efficiency in a subsequent step is deteriorated. Furthermore, the mass ratio can be 20 or less, thereby allowing the treatment of the raw material carbon black to be more efficiently performed.

Dissolution of the organic substance in the solvent can be made by appropriately selecting a procedure that promotes dissolution of the organic substance, from stirring by a stirring blade, or a procedure by ultrasonic vibration, homogenizer or a heating treatment, or a combination thereof. A defoamer or the like can also be appropriately selected because foaming may occur in stirring.

The amount of the raw material carbon black added to the solution in which the organic substance is dissolved is preferably 1 part by weight or more and 50 parts by weight or less, more preferably 5 parts by weight or more and 30 parts by weight or less based on 100 parts by weight of the solvent.

The raw material carbon black can be added in portions to the solution in which the organic substance is dissolved. The raw material carbon black can be diffused in the solution in which the organic substance is dissolved, by a procedure such as screw stirring, shear flow (homogenizer or nanomizer), high-pressure liquid collision or media dispersion (ball mill or bead mill).

Next, the second step of firing the organic substance attached onto the surface of the raw material carbon black is described.

The second step is a step of removing the solvent from the raw material carbon black dispersion liquid, where the organic substance is attached onto the surface of the raw material carbon black, obtained in the first step, and firing the resulting solid content.

A known method can be used as the method for removing the solvent from the raw material carbon black dispersion liquid to extract the solid content. Examples include drying by heating, vacuum drying, centrifugation and filtration under reduced pressure, and drying by heating can be adopted in consideration of the amount of one treatment. Examples of such drying by heating include static drying by leaving to stand under a heating atmosphere, drying by stirring, flash drying that promotes drying by exposing a carbon dispersion liquid to an air current heated, and spray drying that promotes drying by spraying the raw material carbon black dispersion liquid under a heating atmosphere, and spray drying can be adopted in consideration of the amount of treatment and the removal efficiency of the solvent.

A known method can be used as the method for firing the solid content extracted. Firing apparatuses include a direct heating system and an indirect heating system, and an indirect heating system can be adopted because a method of directly heating an object by flame of a burner or the like can have a difficulty in controlling the temperature and can cause such an object to be burned out. Specific examples include an electric furnace, a circulating hot air oven and a high-frequency induction heating furnace, and a circulating hot air oven excellent in uniformity of the heating temperature can be adopted. In addition, heating furnaces include a batch type heating furnace and a continuous heating furnace, and a continuous heating furnace, but having a mechanism of each of loading and discharging, is not suitable for heating for a long time and therefore a batch type heating furnace can be adopted. In order to here suppress excessive firing, the atmosphere in the heating furnace may also be replaced with nitrogen or the like.

The firing temperature can be equal to or more than the thermal decomposition starting temperature of the organic substance and equal to or less than the decomposition temperature of the raw material carbon black. The firing temperature can be equal to or more than the thermal decomposition starting temperature of the organic substance, thereby decomposing the organic substance attached onto the surface of the raw material carbon black to form carbon black treated having a convex shape on the surface thereof. In addition, the firing temperature can be equal to or less than the decomposition temperature of the raw material carbon black, thereby inhibiting the raw material carbon black from being burned out in the treatment step. Specifically, the firing temperature is, for example, preferably 300° C. or more and 600° C. or less, particularly preferably 350° C. or more and 500° C. or less.

The resulting carbon black treated is observed and analyzed for evaluation in the state of being added to and dispersed in the thermoplastic resin and formed into a resin composition.

Observation of the carbon black treated contained in the resin composition is performed by transmission electron microscope (TEM), and production of a sectioned sample before observation is performed by a known method. For example, a sample can be sectioned by an ion beam, a diamond knife or the like. In the following present Example, cutting was made by "ULTRACUT-S" manufactured by Leica Camera AG to collect a cut piece sample for observation, having a thickness of about 40 nm, and a TEM image was captured using H-7100FA manufactured by Hitachi Ltd. as a transmission electron microscope (Transmission Electron Microscopy: TEM) in measurement conditions of a TE mode and an acceleration voltage of 100 kV.

When a TEM image was here captured, the brightness of the image, the contrast thereof, was adjusted so that the lowest gray was more than 0 and the highest gray was less than 255, and the observation magnification was adjusted so that one side of an observation image has a length of 100 nm or more and the resolution is 0.01 nm or more and 1 nm or less per pixel.

In the gray distribution (frequency distribution of the gray information possessed in each pixel constituting the region; horizontal axis: gray, vertical axis: frequency) of the TEM image, if the lowest gray is 0 or the highest gray is 255, the gray of a pixel essentially having the difference in gray information can be identified as 0 or 255 where such a difference is not present depending on brightness and contrast settings for observation. In this case, processing for extraction of a pixel constituting 1% by frequency from the lowest gray in the region described below may be unable to be made.

With respect to the observation magnification, if the length of one side of the image captured is less than 100 nm, an electron beam largely damages an observation region and a proper image may be hardly provided. Furthermore, if the resolution is more than 1 nm per pixel, a region where the carbon black treated, to be essentially observed, is present is difficult to identify. On the other hand, when the length per pixel is less than 0.01 nm, the image size is very large.

Known image analysis software can be used for analysis of the resulting TEM image. Examples of representative image analysis software include trade name: "WinROOF" manufactured by MITANI CORPORATION and trade name: "ImagePro" manufactured by Nippon Roper K.K. In the present Example, trade name: "WinROOF" manufactured by MITANI CORPORATION was used.

The image analysis software is used to determine the area of a region darker and finer than the periphery, which is present in the surface of the carbon black treated and which is considered to have a convex shape, with respect to the TEM image captured. The region darker and finer than the periphery refers to the state where a pixel constituting a lower gray in the gray distribution in a TEM image where the gray is 0 to 255 is collected.

First, a square region in which the carbon black treated occupies 50 area % or more, is extracted from the TEM image by using the image analysis software. Such a square region may preferably be a square region having a size so that a primary particle of the carbon black treated or the entire structure of a primary aggregate is received. In the present disclosure, the square region has a size of 100 nm a side, i.e. 100 nm×100 nm, in which the carbon black treated occupies 50 area % or more with respect to an area of the square region.

In the gray distribution of the square region, pixels resulting from the carbon black treated and constituting 1% by frequency from the lowest gray, is extracted.

Among the extracted pixels, a sum of areas of pixels that are mutually adjacent, i.e. an area of pixel group which is constituted by the mutually adjacent pixels, is calculated. When the area of the pixel group is 10 nm$^2$ or more, such a pixel group can be identified as a region darker and finer than the periphery of the surface of the carbon black treated, which can be visually confirmed.

FIG. 1 is a TEM image obtained by observing the cross section of the cylindrical extrusion product with a transmission electron microscope (TEM) under conditions of a resolution of 0.909 nm/pixel and a lowest gray of more than 0 and a highest gray of less than 255, and having a size of 100 nm a side. In the TEM image, the carbon black treated occupies 68 area %.

FIG. 2 is a graph representing the gray distribution of the TEM image of the carbon black treated having a convex portion on the surface thereof. A plurality of pixels constituting 1% by frequency are extracted based on FIG. 2. That is, a plurality of pixels corresponding to a convex portion on the carbon black treated, which is represented by a region darker and finer than the periphery of the surface of the carbon black treated, are extracted.

That is, when observing a cross section of the cylindrical extrusion product with a transmission electron microscope and obtaining a TEM image under conditions of a resolution of 0.01 to 1 nm/pixel and a lowest gray of more than 0 and a highest gray of less than 255, and extracting from the TEM image a square region of 100 nm a side in which the carbon black occupies 50 area % or more, among pixels in the square region, resulting from the carbon black and constituting 1% by frequency from the lowest gray, pixel group constituted by the pixels that are mutually adjacent, has an area of at least 10 nm$^2$. Thereby, the carbon black treated is specified to have a fine convex portion on the surface thereof.

<Electrophotographic Belt>

The electrophotographic belt can be produced as follows. The belt can be produced by a step of melt-kneading a thermoplastic resin and carbon black surface-treated, to produce a pellet-shaped electrophotographic electro-conductive resin composition, and a step of melting the pellet-shaped electrophotographic electro-conductive resin composition in a uniaxial extruder and extruding the molten product through a cylindrical slit disposed at the tip of the extruder, cooling the resin composition extruded, by a cylindrical cooling mandrel, and cutting the resultant to a predetermined length.

The step of melt-kneading carbon black treated having a convex shape formed on the surface thereof and a thermoplastic resin to produce a pellet-shaped electrophotographic electro-conductive resin composition is described.

Melt-kneading of the carbon black treated and the thermoplastic resin can be performed by a known method. For example, a uniaxial extruder, a biaxial melt-kneading extruder, a Banbury mixer, a roll, a brabender, a plastograph, a kneader or the like can be used. Among these, a uniaxial extruder or a biaxial melt-kneading extruder can be adopted from the viewpoint that a material can be continuously fed and melt-kneaded and the resin composition melt-kneaded is molded to provide a pellet shape. In addition, an additive necessary for the purposes of here enhancing dispersion of the carbon black in the thermoplastic resin and imparting a specified function may also be compounded.

The temperature in melt-kneading with the thermoplastic resin is a temperature equal to or more than the glass transition temperature of the thermoplastic resin and is within the temperature range where the thermoplastic resin is not decomposed. For example, when a polyether ether ketone resin is used, the melt-kneading temperature is preferably 250° C. or more and 400° C. or less, further preferably 300° C. or more and 400° C. or less. If the melt-kneading temperature is equal to or less than the glass transition temperature, the viscosity of the resin is very high, causing large shear to be applied in melt-kneading, to cut the molecular structure of the resin and deteriorate the resin. In addition, if the melt-kneading temperature is 400° C. or more, oxidation and crosslinking of the resin progress, thereby forming a very strong structure into foreign substances.

When the pellet-shaped electrophotographic electro-conductive resin composition is formed into an electrophotographic belt, the resulting pellet-shaped electrophotographic electro-conductive resin composition can be molten in a uniaxial extruder, extruded through a cylindrical slit disposed at the tip of the extruder to provide a tube shape, and the resin composition extruded in the form of a tube by a cylindrical cooling mandrel can be cut to a predetermined length with the temperature thereof being controlled, thereby providing an electrophotographic belt base layer. With respect to the electro-conductivity of the electrophotographic belt of the present disclosure, the volume resistivity is preferably within the range of $1.0\times10^3$ Ωcm or more and $1.0\times10^{14}$ Ωcm or less, more preferably within the range of $1.0\times10^5$ Ωcm or more and $1.0\times10^{13}$ Ωcm or less. In addition, the ratio of the surface resistivity to the volume resistivity of the electrophotographic belt (surface resistivity/volume resistivity) can be within the range of 1 or more and 1000 or less. In addition, the average thickness of the electrophotographic belt base layer can be 25 μm or more and 100 μm or less.

In the electrophotographic belt, a base layer may be coated. Specifically, a surface layer may be formed by dissolving an ultraviolet-curable resin and an electro-conductivity controlling agent in an organic solvent, thereafter coating the surface of the electro-conductive member with the solution according to a slit-coating method, subjecting the organic solvent to drying and thereafter performing irradiation with ultraviolet light.

[Electrophotographic Image Forming Apparatus]

Figure 4:
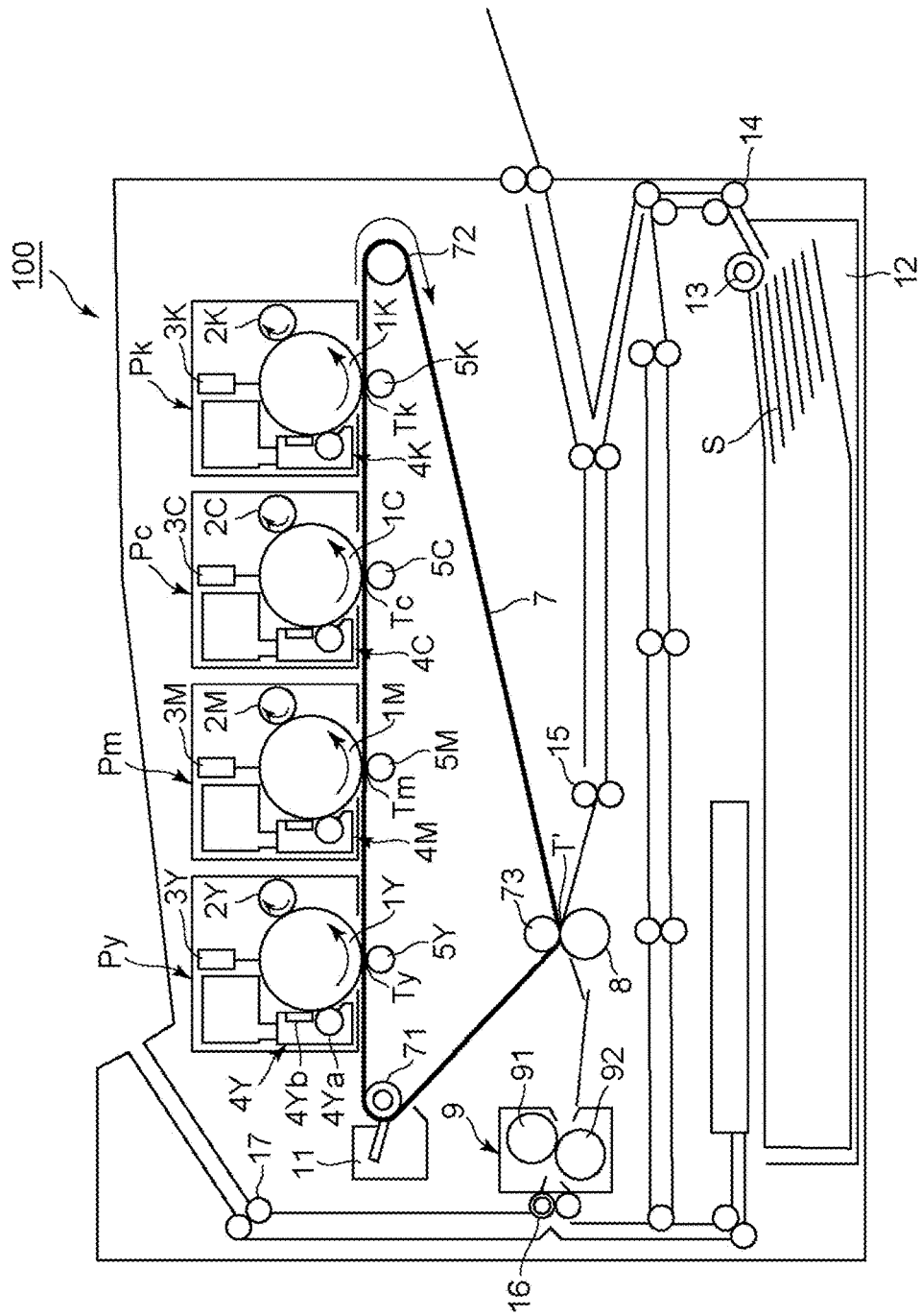
FIG. 4 illustrates schematic views of an electrophotographic image forming apparatus according to one aspect of the present disclosure.

An electrophotographic image forming apparatus 100 illustrated in FIG. 4 is a color electrophotographic image forming apparatus (color laser printer). The electrophotographic image forming apparatus is provided with image forming units Py, Pm, Pc and Pk of respective colors of yellow (Y), magenta (M), cyan (C) and black (K), in sequence in the direction of movement of such units, along with a flat portion of an intermediate transfer belt 7 as an intermediate transfer member. Herein, 1Y, 1M, 1C and 1K each represent an electrophotographic photosensitive member, 2Y, 2M, 2C and 2K each represent a charging roller, 3Y, 3M, 3C and 3K each represent a laser exposure apparatus, 4Y, 4M, 4C and 4K each represent a development section, and 5Y, 5M, 5C and 5K each represent a primary transfer roller. The respective image forming units are the same in basic configuration, and the details of the image forming units are described with reference to only a yellow image forming unit Py.

The yellow image forming unit Py includes a drum-type electrophotographic photosensitive member (hereinafter, also referred to as "photosensitive drum" or "first image carrier") 1Y as an image carrier. The photosensitive drum 1Y is formed by sequentially laminating a charge generation layer, a charge transport layer and a surface protection layer on an aluminum cylinder as a substrate.

The yellow image forming unit Py includes a charging roller 2Y as a charging unit. A charging bias is applied to the charging roller 2Y, thereby evenly charging the surface of the photosensitive drum 1Y. The laser exposure apparatus 3Y is provided, as an image exposure unit, above the photosensitive drum 1Y. The laser exposure apparatus 3Y scan-exposes the surface of the photosensitive drum 1Y evenly charged, depending on image information, to form an electrostatic latent image of a yellow color component on the surface of the photosensitive drum 1Y.

The electrostatic latent image formed on the photosensitive drum 1Y is developed by a toner as a developer in a development section 4Y as a development unit. In other words, the development section 4Y includes a development roller 4Ya as a developer carrier and a regulating blade 4Yb as a member for regulating the amount of the developer, and accommodates a yellow toner as a developer. The development roller 4Ya to which the yellow toner is fed is lightly pressure-contact with the photosensitive drum 1Y in the development section, and is rotated in a forward direction against the photosensitive drum 1Y with the difference in speed. The yellow toner conveyed to the development section by the development roller 4Ya adheres to the electrostatic latent image formed on the photosensitive drum 1Y, by application of a development bias to the development roller 4Ya. Thus, a visible image (yellow toner image) is formed on the photosensitive drum 1Y. The intermediate transfer belt 7 is laid across a driving roller 71, a tension roller 72 and a driven roller 73, and is moved (rotatably driven) in the direction of an arrow in the drawing with being in contact with the photosensitive drum 1Y.

The yellow toner image formed on the photosensitive drum (first image carrier) reaching a primary transfer section Ty is primarily transferred onto the intermediate transfer belt 7 by a primary transfer member (primary transfer roller 5Y) disposed facing the photosensitive drum 1Y with the intermediate transfer belt 7 being interposed therebetween.

Similarly, the above image formation operation is made with respect to each of the units Pm, Pc and Pk of magenta (M), cyan (C) and black (K) according to the movement of the intermediate transfer belt 7, and respective toner images of four colors of yellow, magenta, cyan and black are stacked on the intermediate transfer belt 7. Such toner layers of the four colors are conveyed according to the movement of the intermediate transfer belt 7, and are collectively transferred onto a recording medium S (hereinafter, also referred to as "second image carrier") conveyed at a predetermined timing by a secondary transfer roller 8 as a secondary transfer unit in a secondary transfer section T'. While a transfer voltage of several kV is usually applied in such secondary transfer in order to ensure a sufficient transfer rate, discharge may be here caused in the vicinity of a transfer nip. Such discharge herein causes deterioration in surface characteristics of the intermediate transfer member.

The recording medium S is fed from a cassette 12 in which the recording medium S is received, to a conveyance path by a pick-up roller 13. The recording medium S fed to the conveyance path is conveyed to the secondary transfer section T' in synchronization with the four-color toner image transferred to the intermediate transfer belt 7 by a conveyance roller pair 14 and a resist roller pair 15. The toner image transferred to the recording medium S is fixed by a fixing section 9 and formed into, for example, a full color image. The fixing section 9 includes a fixing roller 91 provided with a heating unit, and a pressure roller 92, and fixes a toner image not fixed, on the recording medium S, by heating and pressurizing. Thereafter, the recording medium S is ejected outside the apparatus by a conveyance roller pair 16, an ejection roller pair 17 and the like.

A cleaning blade 11 as a cleaning unit of the intermediate transfer belt 7 is provided downstream of the secondary transfer section T' in the driving direction of the intermediate transfer belt 7, and removes the transfer residual toner which is not transferred to the recording medium S in the secondary transfer section T' and which remains on the intermediate transfer belt 7.

As described above, an electrical transfer process of the toner image, from the photosensitive member to the intermediate transfer belt and from the intermediate transfer belt to the recording medium, is repeatedly performed. In addition, recording on a large number of recording media is repeated, resulting in further repeating of such an electrical transfer process.

The above electrophotographic member can be then used in the intermediate transfer belt in the electrophotographic image forming apparatus, thereby forming a high-quality electrophotographic image.

According to one embodiment of the present disclosure, an electrophotographic belt that is improved in thickness variation and that is a cylindrical extrusion product providing an excellent print image quality can be obtained.

In addition, according to another embodiment of the present disclosure, an electrophotographic image forming apparatus that can form a high-quality electrophotographic image can be obtained.

EXAMPLES

Hereinafter, Examples of the electrophotographic belt according to the present embodiment are shown. All of a step of surface-treating the raw material carbon black to prepare carbon black treated having a fine convex shape, a step of melt-kneading the thermoplastic resin and the carbon black treated, to prepare a pellet-shaped electrophotographic electro-conductive resin composition and a step of melting and extruding the electrophotographic electro-conductive resin composition by a uniaxial extruder, to provide an electrophotographic belt in the present embodiment were performed in a common apparatus. The present embodiment is not intended to be limited to the following Examples.

Example 1

<Production of Electrophotographic Belt>

After 10 parts by weight of a nonionic surfactant (polyoxyethylene alkyl ether) (trade name "Nanoacty" manufactured by Sanyo Chemical Industries, Ltd.) was added to and dissolved in 100 parts by weight of water, 15 parts by weight of raw material carbon black (trade name: "Denka Black"

manufactured by Denka Company Limited) was added thereto. The ratio "A/B" was 1.5 in the assumption that the part(s) by mass of the raw material carbon black and the part(s) by mass of the surfactant based on 100 parts by weight of water were defined as A and B, respectively.

Stirring was made by a bead mill (trade name "α-mill" manufactured by Aimex Co., Ltd.), to provide a raw material carbon black dispersion liquid. The water content of the raw material carbon black dispersion liquid was removed using a spray dryer (trade name "Spray dryer L-8i" manufactured by Yamato Scientific Co., Ltd.), to provide a solid content. The resulting solid content was fired by a high-temperature furnace (trade name: "Constant temperature dryer DR 200" manufactured by Yamato Scientific Co., Ltd.) at a temperature of 400° C. for 5 hours, to provide carbon black treated.

Next, the carbon black treated and polyether ether ketone (PEEK) (trade name "Victrex PEEK381G" manufactured by Victrex PLC) were mixed so that 25 parts by weight of the carbon black treated, based on 100 parts by weight of PEEK, was mixed, the mixture was melt-kneaded using a continuous biaxial extruder (trade name: TEX30α, manufactured by Japan Steel Works, LTD.) to prepare a thermoplastic resin composition, thereby providing a pellet-shaped electro-conductive resin composition. The temperature in such melt-kneading was adjusted so as to be within the range of 350° C. or more and 380° C. or less. Furthermore, the resulting pellet-shaped electro-conductive resin composition was loaded into a uniaxial screw extruder (trade name: GT40, manufactured by PLABOR Research Laboratory of Plastics Technology Co., Ltd) where the setting temperature was set to 380° C., and melt-extruded by an annular die. The resultant was cooled and solidified by a cylindrical cooling mandrel, and cut to a predetermined length, thereby providing an electrophotographic belt having a thickness of 40 μm.

<Evaluation of Electrophotographic Belt>
<Evaluation 1: Evaluation of Thickness/Thickness Variation of Electrophotographic Belt>

The thickness of the resulting electrophotographic belt was evaluated using a digital thickness meter (trade name: "Dual type thickness meter SWT-9000/FN325" manufactured by Sanko Electronic Laboratory Co., Ltd.). Thickness measurement points were 35 points determined by phase shifting in the circumferential direction by 10° based on a certain phase, with respect to each location, excluding both ends, obtained by evenly cutting the width of the electrophotographic belt into sixths, and the difference between the maximum value and the minimum value among a plurality of measurement points on the surface of the electrophotographic belt was evaluated as the thickness variation.

<Evaluation 2: TEM Image Analysis of Carbon Black Treated, in Electrophotographic Belt>

The observation and evaluation of the carbon black treated, in the resulting electrophotographic belt, were performed as described above. The cross section of the cylindrical extrusion product was observed under conditions of a resolution of 0.01 nm/pixel or more and 1 nm/pixel or less and a lowest gray of more than 0 and a highest gray of less than 255 to provide a TEM image, and the area of pixel groups mutually adjacent, among a plurality of pixels due to the carbon black, the pixels constituting 1% by frequency from the lowest gray, in a region of 100 nm×100 nm, where the area ratio of the carbon black was 50% or more, of the TEM image was determined.

<Evaluation 3: Surface Property Evaluation of Electrophotographic Belt/Number of Electrophotographic Belts where Foreign Substances Occurred>

The surface property of the resulting electrophotographic belt was evaluated by visually measuring the number of foreign substances on the belt surface, and the number of electrophotographic belts among 20 belts, where one or more foreign substances occurred, was rated according to the following criteria.

Rank "AA": 0;
Rank "A": 1 or more and less than 5;
Rank "C": 5 or more.

<Evaluation 4: Evaluation of Martens Hardness of Electrophotographic Belt Surface>

The Martens hardness of the surface of the resulting electrophotographic belt was measured using a film hardness meter manufactured by Fischer Instruments K.K.: Picodentor HM 500. The rear side of the measurement surface of an electrophotographic belt sample cut to about 1 cm square was bonded to a glass slide by an instant adhesive, and the resultant was measured using a Berkovich-type diamond indenter. The measurement conditions were as follows: the pressing speed was 1 mN/sec, the pressing depth was 2 μm, the retention time was 5 sec and the number of measurement points was 20 at an interval of 1 mm or more; and the average value was defined as the surface hardness.

<Evaluation 5: Evaluation of Print Image Quality>

The electrophotographic belt produced was installed as an intermediate transfer belt to an intermediate transfer unit of a copier (trade name "IR-ADVANCE C5051" manufactured by Canon Inc.), and an image quality test was performed. The initial printing test was performed in a full color image for 20 sheets where the same image was output, using A4-size paper (trade name "GF-600" (basis weight: 60 g/m$^2$) manufactured by Canon Inc.) under an environment of a temperature of 15° C. and a humidity of 10% RH. The image on each of such 20 sheets subjected to printing was visually confirmed about whether the density variation as image failure such as color irregularity and a solid portion occurred or not, and the results were rated according to the following criteria.

Rank "A": no image failure was observed in all images.
Rank "B": image failure was observed in any of images.

Furthermore, a full color image was printed for 600000 sheets in the same environment, and a paper-feeding endurance test was performed. After the paper-feeding endurance test, a solid image of a magenta color was printed for 20 sheets in order to confirm an image printed, with respect to the entire periphery of the intermediate transfer belt. The image on each of such 20 sheets obtained by outputting was visually confirmed about whether the density variation as image failure occurred or not, and the results were rated according to the following criteria.

Rank "A": no density variation was observed in all print images.
Rank "B": image failure was observed in 3 sheets or less print images.
Rank "C": image failure was observed in 4 sheets or more print images.

The evaluation results are shown in Table 2.

Examples 2 to 10 and Comparative Examples 1 to 5

An electrophotographic belt as an electro-conductive member of each of Examples 2 to 10 and Comparative Examples 1 to 5 was produced by the same production method as in Example 1 by each material formulation and each compounding ratio described in Tables 1-1, 1-2 and 1-3 below. In Example 8, polyphenylene sulfide (hereinafter, PPS) was used as the thermoplastic resin, and therefore melt-kneading was performed at a temperature of 290° C. or more and 330° C. or less. In Example 9, polybutylene naphthalate (hereinafter, PBN) was used as the thermoplastic resin, and therefore melt-kneading was performed at a temperature of 250° C. or more and 300° C. or less. In Example 10, polyvinylidene fluoride (hereinafter, PVDF) was used as the thermoplastic resin, and therefore melt-kneading was performed at a temperature of 180° C. or more and 270° C. or less.

With respect to the thermoplastic resins other than the PEEK resin described in Tables 1-1, 1-2 and 1-3 below, trade name "Torelina" manufactured by Toray Industries, Inc. was used as the PPS resin, trade name "polybutylene naphthalate resin" manufactured by Teijin Limited was used as the PBN resin, and trade name "Solef 9007" manufactured by Solvey was used as the PVDF resin, respectively. With respect to the carbon blacks other than acetylene black described in Tables 1-1, 1-2 and 1-3 below, trade name "Mitsubishi carbon black #3050B" manufactured by Mitsubishi Chemical Corporation was used as furnace black, trade name "Thermax" manufactured by Tokai Carbon Co., Ltd. was used as thermal black, and trade name "ketjen black EC300J" manufactured by Lion Specialty Chemicals Co., Ltd. was used as ketjen black, respectively. With respect to the surfactants other than the nonionic surfactant described in Tables 1-1, 1-2 and 1-3 below, trade name "Acetamin 24" manufactured by Kao Corporation was used as the cationic surfactant and trade name "Demol MS" manufactured by Kao Corporation was used as the anionic surfactant, respectively.

TABLE 1-1

|  | Example 1 | Example 2 | Example 3 | Example 4 | Example 5 |
|---|---|---|---|---|---|
| Thermoplastic resin | PEEK | PEEK | PEEK | PEEK | PEEK |
| Carbon black | Acetylene black | Acetylene black | Acetylene black | Acetylene black | Furnace black |
| Organic substance attached onto surface | Nonionic surfactant | Nonionic surfactant | Cationic surfactant | Anionic surfactant | Nonionic surfactant |
| Ratio (part(s) by weight) of carbon black/organic substance (based on 100 parts by weight of water) | 1.5 | 10 | 2 | 1 | 2 |

TABLE 1-2

|  | Example 6 | Example 7 | Example 8 | Example 9 | Example 10 |
|---|---|---|---|---|---|
| Thermoplastic resin | PEEK | PEEK | PPS | PBN | PvDF |
| Carbon black | Thermal black | Ketjen black | Acetylene black | Acetylene black | Acetylene black |
| Organic substance attached onto surface | Nonionic surfactant | Nonionic surfactant | Nonionic surfactant | Nonionic surfactant | Nonionic surfactant |
| Ratio (part(s) by weight) of carbon black/organic substance (based on 100 parts by weight of water) | 2 | 2 | 1.5 | 1.5 | 1.5 |

TABLE 1-3

|  | Comparative Example 1 | Comparative Example 2 | Comparative Example 3 | Comparative Example 4 | Comparative Example 5 |
|---|---|---|---|---|---|
| Thermoplastic resin | PEEK | PEEK | PEEK | PPS | PBN |
| Carbon black | Acetylene black | Furnace black | Thermal black | Acetylene black | Acetylene black |
| Organic substance attached onto surface | — | — | — | — | — |
| Ratio (part(s) by weight) of carbon black/organic substance (based on 100 parts by weight of water) | — | — | — | — | — |

Each of the electrophotographic belts produced was evaluated in the same manner as in Example 1 with respect to the thickness/thickness variation of each of the electrophotographic belts, observation of the surface of the carbon black in each of the electrophotographic belts, surface property (the number of belts where failure due to foreign substances was observed) of each of the electrophotographic belts, the Martens hardness of the surface of each of the electrophotographic belts, and the print image quality. The evaluation results are shown in Table 2.

TABLE 2

|  | Evaluation 1 | | | | | Evaluation 5 | |
| --- | --- | --- | --- | --- | --- | --- | --- |
|  | Thickness | Thickness variation | Evaluation 2 | Evaluation 3 | Evaluation 4 | Initial | After long-term usage |
| Example 1 | 40 μm | 0.2 μm | 12 nm$^2$ | AA | 205 | A | A |
| Example 2 | 40 μm | 0.4 μm | 10 nm$^2$ | AA | 210 | A | A |
| Example 3 | 40 μm | 0.2 μm | 11 nm$^2$ | AA | 200 | A | A |
| Example 4 | 40 μm | 0.1 μm | 17 nm$^2$ | AA | 210 | A | A |
| Example 5 | 40 μm | 0.3 μm | 15 nm$^2$ | A | 198 | A | A |
| Example 6 | 40 μm | 0.4 μm | 13 nm$^2$ | A | 198 | A | A |
| Example 7 | 40 μm | 0.3 μm | 15 nm$^2$ | A | 200 | A | A |
| Example 8 | 40 μm | 0.2 μm | 13 nm$^2$ | AA | 181 | A | A |
| Example 9 | 40 μm | 0.2 μm | 16 nm$^2$ | AA | 132 | A | B |
| Example 10 | 40 μm | 0.3 μm | 13 nm$^2$ | AA | 121 | A | B |
| Comparative Example 1 | 40 μm | 5 μm | 4 nm$^2$ | AA | 198 | B | C |
| Comparative Example 2 | 40 μm | 7 μm | 6 nm$^2$ | A | 200 | B | C |
| Comparative Example 3 | 40 μm | 4 μm | 7 nm$^2$ | A | 210 | B | C |
| Comparative Example 4 | 40 μm | 2 μm | 3 nm$^2$ | AA | 177 | B | C |
| Comparative Example 5 | 40 μm | 5 μm | 5 nm$^2$ | AA | 142 | B | C |

It could be confirmed that the electrophotographic belt according to each of Example 1 to Example 10, although was thin, was remarkably reduced in the thickness variation.

On the other hand, the occurrence of image failure was confirmed by an increase in the thickness variation due to a decrease in the thickness in the electrophotographic belt according to each of Comparative Example 1 to Comparative Example 5.

The maximum area according to TEM image analysis of the electrophotographic belt according to each of Example 1 to Example 10 was at least 10 nm$^2$ or more. It was here considered that the carbon black treated had a fine convex shape on the surface thereof and the contact area of the periphery thereof with the thermoplastic resin was thus reduced to decrease flow resistance. Therefore, the thickness variation with respect to an endless belt shape could be further improved by cylindrical extrusion.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-106887, filed May 30, 2017, and Japanese Patent Application No. 2018-87298, filed Apr. 27, 2018, which are hereby incorporated by reference herein in their entirety.

What is claimed is:

1. An endless electrophotographic belt, comprising:
   an electro-conductive base layer comprising a thermoplastic resin and carbon black, the base layer being a cylindrical extrusion product of a resin mixture comprising the thermoplastic resin and the carbon black, wherein
   when observing a cross section of the cylindrical extrusion product with a transmission electron microscope (TEM) and obtaining a TEM image with a resolution of 0.01 to 1 nm/pixel, the TEM image including a lowest gray of more than 0 and a highest gray of less than 255, and extracting from the TEM image a square region of 100 nm a side in which the carbon black occupies 50 area % or more,
   among pixels in the square region resulting from the carbon black and constituting 1% by frequency from the lowest gray in a frequency distribution of gray information possessed in each pixel constituting the square region of which a horizontal axis represents gray and vertical axis represents frequency, a pixel group constituted by the pixels that are mutually adjacent having an area of at least 10 nm$^2$ is observed.

2. The electrophotographic belt according to claim 1, wherein the thermoplastic resin is polyether ether ketone or polyphenylene sulfide.

3. The electrophotographic belt according to claim 1, wherein an average thickness of the base layer is 25 to 100 μm.

4. The electrophotographic belt according to claim 1, wherein the carbon black has a convex portion derived by firing an organic substance attached on a surface the carbon black.

5. The electrophotographic belt according to claim 4, wherein the carbon black is formed by attaching an organic substance onto a surface of a raw material carbon black and firing the organic substance.

6. The electrophotographic belt according to claim 5, wherein the raw material carbon black is acetylene black.

7. An electrophotographic image forming apparatus, comprising:
   an electrophotographic photosensitive member;
   an intermediate transfer belt to which a toner image formed on the electrophotographic photosensitive member is to be primarily transferred, the intermediate transfer belt being an endless electrophotographic belt comprising an electro-conductive base layer comprising a thermoplastic resin and carbon black, the base layer being a cylindrical extrusion product of a resin mixture comprising the thermoplastic resin and the carbon black; and a secondary transfer unit that secondarily transfers a toner image, transferred on the intermediate transfer belt, to a recording medium, wherein when observing a cross section of the cylindrical extrusion product with a transmission electron microscope (TEM) and obtaining a TEM image with a resolution of 0.01 to 1 nm/pixel, the TEM image including a lowest gray of more than 0 and a highest gray of less than 255, and extracting from the TEM image a square region of 100 nm a side in which the carbon black occupies 50 area % or more, among pixels in the square region resulting from the carbon black and constituting 1% by frequency from the lowest gray in a frequency distribution of gray information possessed in each pixel constituting the square region of which a horizontal axis represents gray and vertical axis represents frequency, a pixel group constituted by the pixels that are mutually adjacent having an area of at least 10 $nm^2$ is observed.

* * * * *